(12) United States Patent
Dziendziel et al.

(10) Patent No.: US 7,166,797 B1
(45) Date of Patent: Jan. 23, 2007

(54) TANDEM FILTERS USING FREQUENCY SELECTIVE SURFACES FOR ENHANCED CONVERSION EFFICIENCY IN A THERMOPHOTOVOLTAIC ENERGY CONVERSION SYSTEM

(75) Inventors: Randolph J. Dziendziel, Middle Grove, NY (US); David Moore DePoy, Clifton Park, NY (US); Paul Francis Baldasaro, Clifton Park, NY (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 685 days.

(21) Appl. No.: 10/217,441

(22) Filed: Aug. 14, 2002

Related U.S. Application Data (60) Provisional application No. 60/314,174, filed on Aug. 23, 2001.

(51) Int. Cl.
*H01L 31/052* (2006.01)
(52) U.S. Cl. .................. 136/253; 136/246; 136/259; 136/257; 257/432; 257/435; 250/216; 359/586; 359/589; 359/588; 359/587; 359/839; 359/590; 359/359; 359/360
(58) Field of Classification Search ............. 136/253, 136/246, 259, 257; 257/432, 435; 250/216; 359/586, 589, 588, 587, 839, 590, 359, 360
See application file for complete search history.

(56) References Cited

U.S. PATENT DOCUMENTS

| | | | | |
|---|---|---|---|---|
| 5,403,405 A | * | 4/1995 | Fraas et al. ................. | 136/253 |
| 5,488,511 A | * | 1/1996 | Rahmlow, Jr. .............. | 359/586 |
| 5,611,870 A | * | 3/1997 | Horne et al. ................ | 136/253 |
| 5,700,332 A | * | 12/1997 | Brown et al. ............... | 136/253 |
| 6,689,949 B2 | * | 2/2004 | Ortabasi ..................... | 136/246 |

OTHER PUBLICATIONS

Black et al, "Thermophotovoltaics—Development Status and Parametric Considerations for Power Applications," Eighteenth International Conference on Thermoelectrics, pp. 639-644, meeting date Aug. 29, 1999-Sep. 2, 1999, published in 1999.*

(Continued)

*Primary Examiner*—Alan Diamond
(74) *Attorney, Agent, or Firm*—Linda P. Field; Paul A. Gottlieb (57) ABSTRACT

This invention relates to the field of thermophotovoltaic (TPV) direct energy conversion. In particular, TPV systems use filters to minimize parasitic absorption of below bandgap energy. This invention constitutes a novel combination of front surface filters to increase TPV conversion efficiency by reflecting useless below bandgap energy while transmitting a very high percentage of the useful above bandgap energy. In particular, a frequency selective surface is used in combination with an interference filter. The frequency selective surface provides high transmission of above bandgap energy and high reflection of long wavelength below bandgap energy. The interference filter maintains high transmission of above bandgap energy and provides high reflection of short wavelength below bandgap energy and a sharp transition from high transmission to high reflection.

41 Claims, 10 Drawing Sheets

OTHER PUBLICATIONS

Raynolds et al, an abstract entitled "Micron-scale Frequency Selective Surfaces for Thermo-Photovoltaic Spectral Control," American Physical Society, Annual March Meeting, Mar. 12-16, 2001, published Mar. 2001.*

Baldasaro et al, "Thermodynamic analysis of thermophotovoltaic efficiency and power density tradeoffs," Journal of Applied Physics, vol. 89(6), pp. 3319-3327, Mar. 15, 2001.*

Brown et al, "Segregated tandem filters for enhanced conversion efficiency in a thermophotovoltaic energy conversion system," dated Jul. 7, 1998, OSTI, for U.S. Appl. No. 08/678,741.*

Martin et al, "Sputtered Si:H alloys for edge filters : application to thermophotovoltaics," Applied Optics, vol. 41, No. 31, pp. 6702-6707, Nov. 1, 2002.*

* cited by examiner

TANDEM FILTERS USING FREQUENCY SELECTIVE SURFACES FOR ENHANCED CONVERSION EFFICIENCY IN A THERMOPHOTOVOLTAIC ENERGY CONVERSION SYSTEM

PRIORITY

This application claims benefit of Provisional Patent Application No. 60/314,174 filed Aug. 23, 2001.

FIELD OF INVENTION

This invention was made under a contract with the U.S. Department of Energy. The present invention relates to the field of thermophotovoltaic direct energy conversion. In particular, the present invention relates to filters used to reduce parasitic absorption of below bandgap energy in thermophotovoltaic systems.

BACKGROUND

Thermophotovoltaic (TPV) energy systems convert thermal energy to electric power using the same principle of operation as solar cells. In particular, a heat source radiatively emits photons that are incident on a semiconductor TPV device with an energy (E) spectrum that can be characterized by Planck's blackbody distribution modified to account for the radiator surface spectral emissivity. The wavelength ($\lambda$) of a photon is inversely proportional to its photon energy and can be calculated from $\lambda = hc/E$ where h is Planck's constant and c is the speed of light. Photons with energy greater than the semiconductor bandgap ($E_g$) (typically ranging from 0.50 to 0.74 eV for TPV devices) excite electrons from the valence band to the conduction band of the semiconductor material (interband transition). The resultant electron-hole pairs are then collected and can be used to power electrical loads. Photons with energy less than the semiconductor bandgap cannot be converted to electrical energy and, therefore, are parasitically absorbed as heat. In order to increase the conversion efficiency of a TPV system, some form of spectral control is employed to reduce the amount of below bandgap energy that is parasitically absorbed.

Various spectral control methods have been proposed to improve TPV conversion efficiency. In one method, the emission spectrum of the photon radiator is changed to suppress emission of below bandgap energy. Several techniques have been used including surface texturing and rare earth oxide coatings. U.S. Pat. No. 4,764,104 to Nelson reports a narrow band thermally energized radiation source composed of a rare earth oxide radiator member. When heated to about 1700 degrees C., the rare earth oxide radiator member has a concentrated radiated flux over the 0.4 to 2.5 micrometer wavelength range such that at least 50% of the radiated flux is within a spectral band that is less than 0.4 micrometers wide. The significant issue with this type of selective radiator for some applications is the reduction of above bandgap energy incident on the TPV device compared with TPV systems that employ high emissivity blackbody radiators. This reduction in available above bandgap energy causes a reduced electrical output surface power density.

In another method, a highly reflective coating is applied to the back surface of the TPV device. The TPV device is designed such that the above bandgap (useful) energy is absorbed in the active layers of the TPV device. The TPV device is further designed such that most of the below bandgap (useless) energy passes through the TPV device and is reflected back to the radiator after passing through the TPV device a second time. This method was reported by An-Ti Chai, *Back Surface Reflection for Solar Cells*, the Fourteenth IEEE Photovoltaics Specialists Conference, 1980. A critical issue associated with this approach is the amount of below bandgap energy parasitically absorbed during transit through the TPV device.

In yet another method, a selective filter is placed in front of the TPV device. The filter is designed to transmit most of the above bandgap energy to the TPV device and reflect most of the below bandgap energy back to the radiator. The effectiveness of a TPV device is a strong function of the filter's ability to minimize parasitic absorption by achieving a very high reflection of below bandgap energy as well as minimizing absorption of above bandgap energy in the filter. This spectral control method is described in *An Experimental Assessment of Low Temperature Voltaic Energy Conversion*, PF Baldasaro et al., First NREL Conference on Thermophotovoltaic Generation of Electricity, Jul. 24–27, 1994.

In a TPV energy conversion system, spectral control via selective filters requires a filter (or filter system) with certain characteristics. First, there should be a high transmission of energy above the TPV device semiconductor bandgap (energy with wavelength less than the wavelength corresponding to the TPV device semiconductor bandgap ($\lambda_g$) which is equal to $1.24/E_g$ where the unit for $E_g$ is electron-volts and the unit for wavelength is micrometers). Second, there should be a high reflection of energy below the TPV device semiconductor bandgap (energy with wavelength greater than $\lambda_g$). Third, there should be a sharp transition from high transmission (low reflection) to high reflection at the wavelength corresponding to the TPV cell semiconductor bandgap. Fourth, there should be minimal absorption of above bandgap energy in the filter itself.

Figure 1:
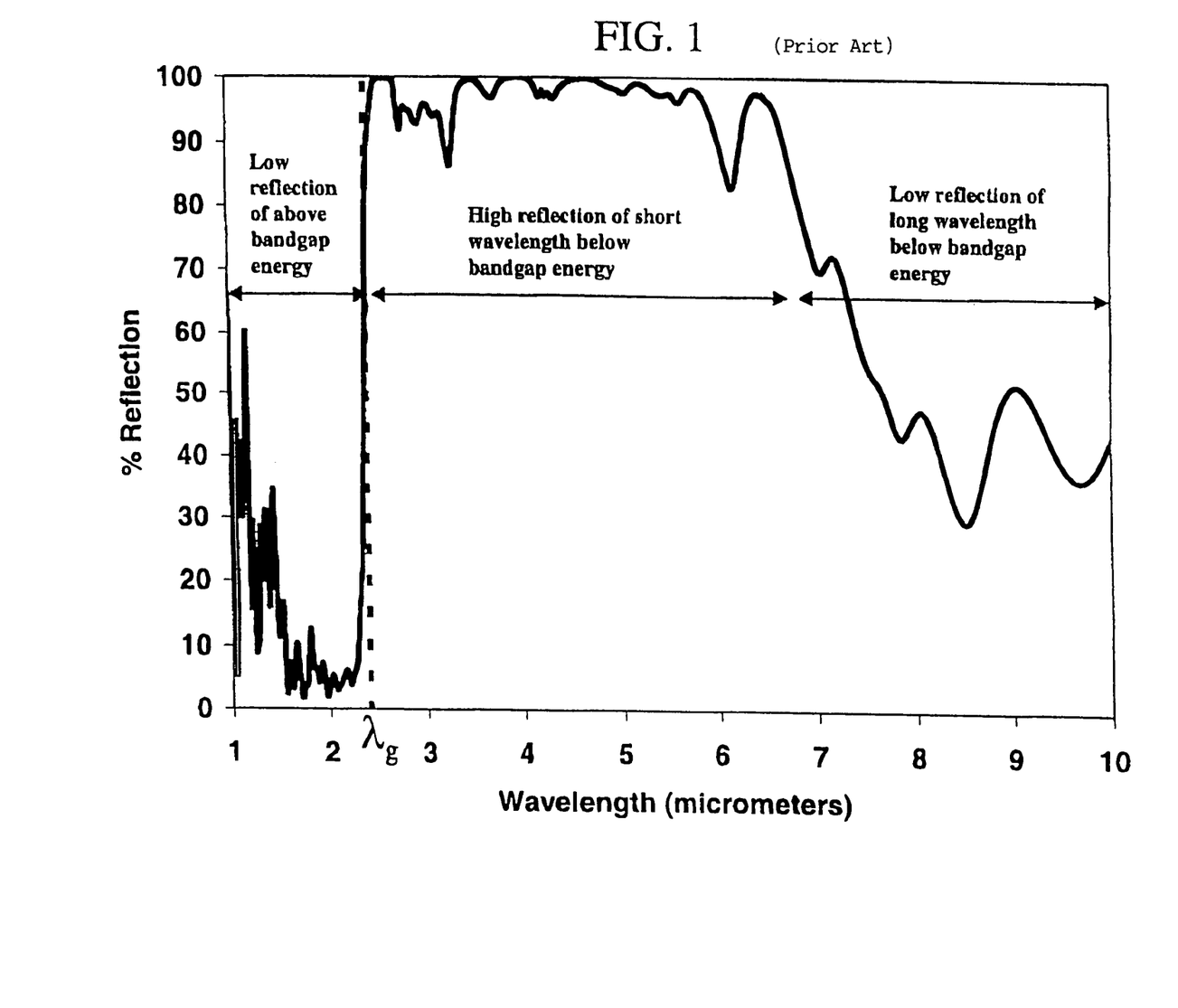
FIG. 1 illustrates the measured performance of a typical interference filter; specifically it presents the filter's reflection as a function of incident wavelength.

In general, no single filter has been identified that meets all of these characteristics. Interference filters are multilayer stacks of non-absorbing dielectric or semiconductor materials with alternating high and low indices of refraction. The measured performance of a typical interference filter used in a thermophotovoltaic system is illustrated in FIG. 1 wherein the typical interference filter's reflectivity is shown as a function of incident wavelength. As shown in FIG. 1, the typical interference filter demonstrates an abrupt transition between the low reflection and high reflection regions. As further shown in FIG. 1, the reflection zone of the typical interference filter extends to approximately 6 micrometers. In most TPV systems, 25% of the blackbody radiation is emitted with wavelengths greater than the reflective range of a practical interference filter, therefore, an interference filter alone does not meet all of the desired filter characteristics described above.

A plasma filter is a single layer of material (typically a semiconductor material) with a high concentration of free charge carriers (typically greater than $5 \times 10^{19}$ carriers per $cm^3$). The concentration of free charge carriers (N) present in a plasma filter determines the plasma wavelength, $\lambda_p$. For $N \sim 5 \times 10^{19}$ $cm^{-3}$, $\lambda_p$ is approximately 5 micrometers for typical semiconductor plasma filters. In general, plasma filters provide high transmission of energy with wavelength less than $\lambda_p$, and high reflection for energy with wavelength greater than $\lambda_p$. However, plasma filters exhibit an absorption peak that occurs at the plasma wavelength and, therefore, do not exhibit a sharp transition from high transmission to high reflection. Therefore, a plasma filter with plasma wavelength approximately equal to the semiconductor device bandgap would provide high reflection for below bandgap energy, but would also exhibit a large amount of parasitic absorption of above bandgap energy. Shifting the plasma wavelength of the plasma filter to longer wavelengths reduces the parasitic absorption of above bandgap energy, but also reduces the reflectivity of shorter wavelength below bandgap energy.

Figure 2:
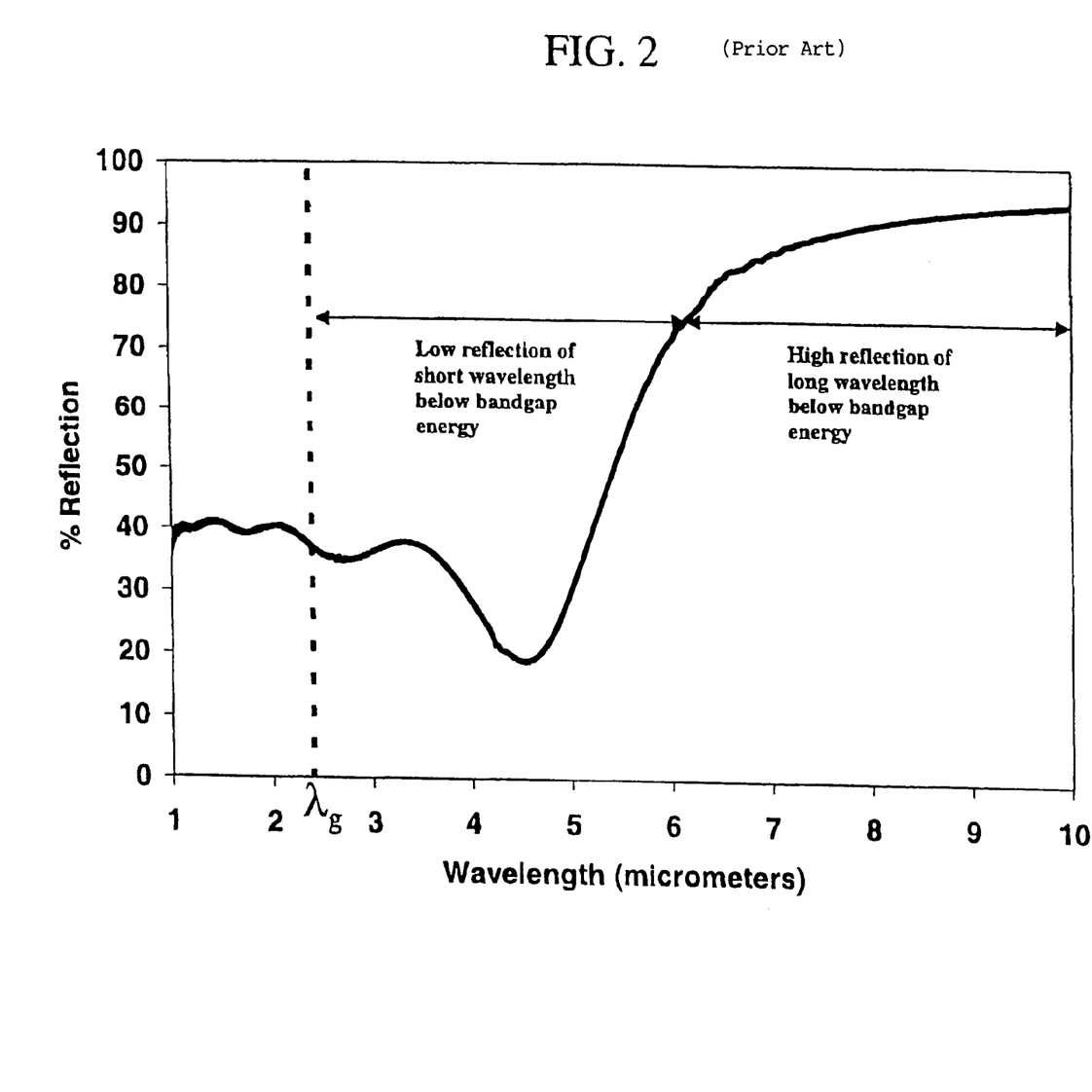
FIG. 2 illustrates the measured performance of a typical plasma filter; specifically it presents the filter's reflection as a function of incident wavelength.

The measured performance of a typical plasma filter is illustrated in FIG. 2 wherein the typical plasma filter's reflectivity is shown as a function of incident wavelength. As shown in FIG. 2, the typical plasma filter shows a gradual transition between the low reflection and high reflection regions. Further, the high reflection zone of the typical plasma filter extends into the long wavelength regions. As shown in FIG. 2, the typical plasma filter alone does not meet all of the desired filter characteristics described above.

Previous researchers have proposed the combination of an interference filter with a plasma filter in various tandem arrangements to overcome the limitations of each component. U.S. Pat. No. 4,017,758 to Almer, suggested this solution for application in incandescent light bulbs in 1977. U.S. Pat. No. 5,403,405 to Fraas, et al., proposed this concept for application in a TPV energy conversion system in 1993. This combination of filters was improved upon in U.S. Pat. No. 5,700,332 to Brown, et al., by providing a physical separation between the interference filter and the plasma filter to provide improved performance of the filter system. U.S. Pat. No. 6,043,426 to DePoy, et al., further improved upon this concept by incorporating the plasma filter as the top layer in the TPV device.

Figure 3:
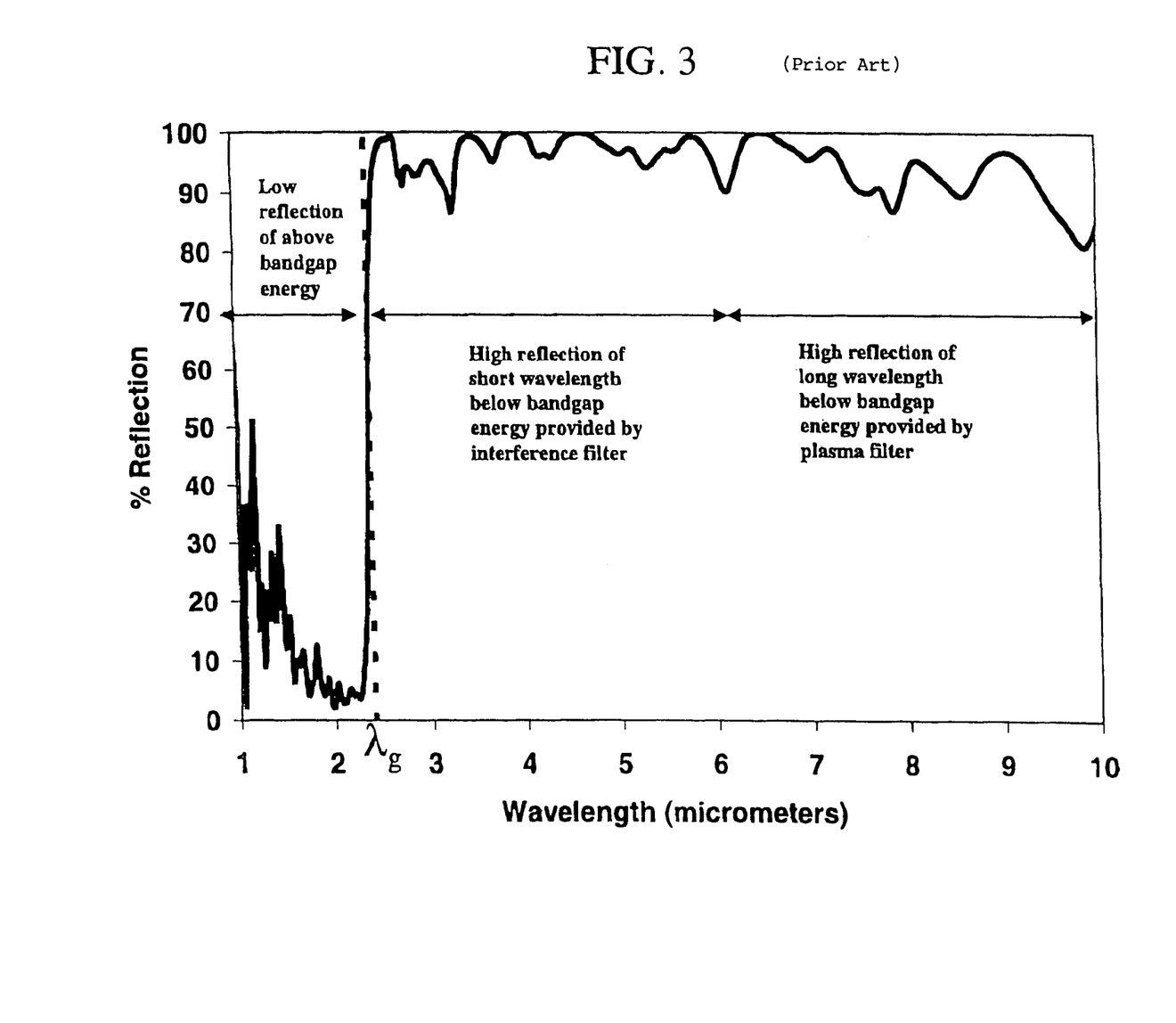
FIG. 3 illustrates the measured performance of a typical tandem filter fabricated using a typical interference filter and a typical plasma filter; specifically it presents the filter's reflection as a function of incident wavelength.

FIG. 3 illustrates the measured reflection versus wavelength for a typical high performance tandem filter that combines an interference filter and a plasma filter. For this tandem filter concept, the interference filter is located on top of the plasma filter (between the plasma filter and the radiator). The plasma filter has a plasma wavelength of approximately 5 micrometers and provides high reflection of long wavelength below bandgap energy. The plasma filter also exhibits very low parasitic absorption of above bandgap energy. The interference filter provides high transmission of above bandgap energy, high reflection of short wavelength below bandgap energy and a sharp transition from high transmission to high reflection. Each filter compensates for the weaknesses of the other, and, taken together, the filter system satisfies each of the requirements listed above.

A third type of filter is called a frequency selective surface (FSS). A frequency selective surface is a two-dimensional periodic array of electromagnetic scattering elements. These elements consist of either patches (isolated metal elements) or apertures (holes in a metal layer). The spectral performance (reflection and transmission versus wavelength) of an FSS is governed by the size, shape, and spacing of the electromagnetic scattering elements. U.S. Pat. No. 5,611,870 to Horne and Morgan, proposed the use of a frequency selective surface as a filter array for modifying radiant thermal energy in photovoltaic and thermophotovoltaic systems. U.S. Pat. No. 5,861,226 to Horne and Morgan, also proposed a method of fabricating the filter array (FSS) using a masked ion beam lithography process.

Figure 4:
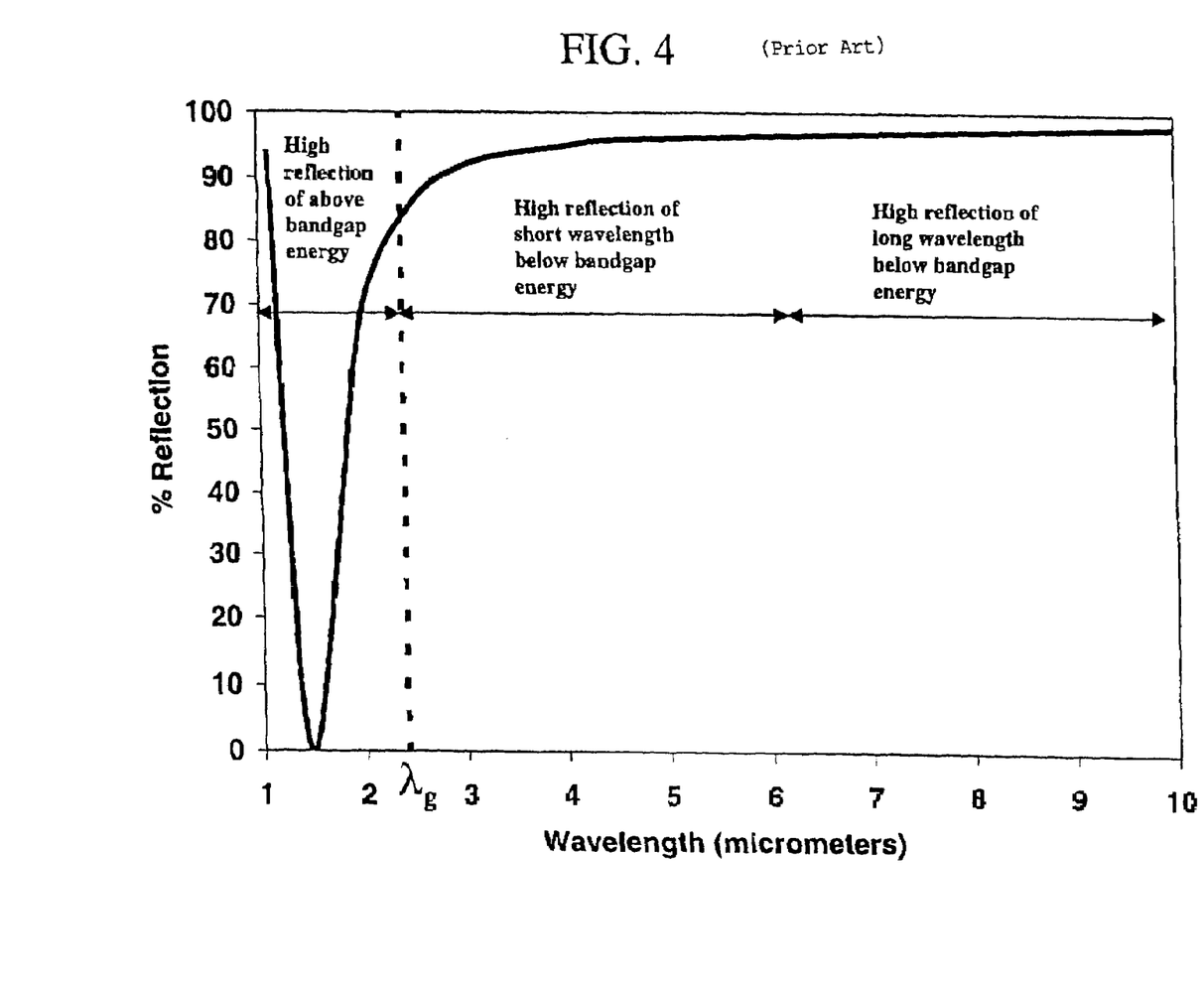
FIG. 4 illustrates the expected performance of a typical frequency selective surface designed to provide high reflection for all below bandgap energy; specifically it presents the filter's reflection as a function of incident wavelength.

FSS filters typically provide excellent reflection of long wavelength below bandgap energy. However, a performance tradeoff exists between the transmission of above bandgap energy and the reflection of short wavelength below bandgap energy. FSS filters that have high transmission of above bandgap energy typically do not provide the desired sharp transition to high reflection and, therefore, do not have high reflection of short wavelength below bandgap energy. FIG. 4 illustrates the reflection versus wavelength of a typical frequency selective surface designed to provide high reflection of all below bandgap energy. Although this filter provides high reflection of all below bandgap energy, it suffers from very low integrated transmission of above bandgap energy caused by high above bandgap reflection. Therefore, frequency selective surfaces designed to maximize reflection of below bandgap energy do not meet all of the desired filter characteristics described above.

Figure 5:
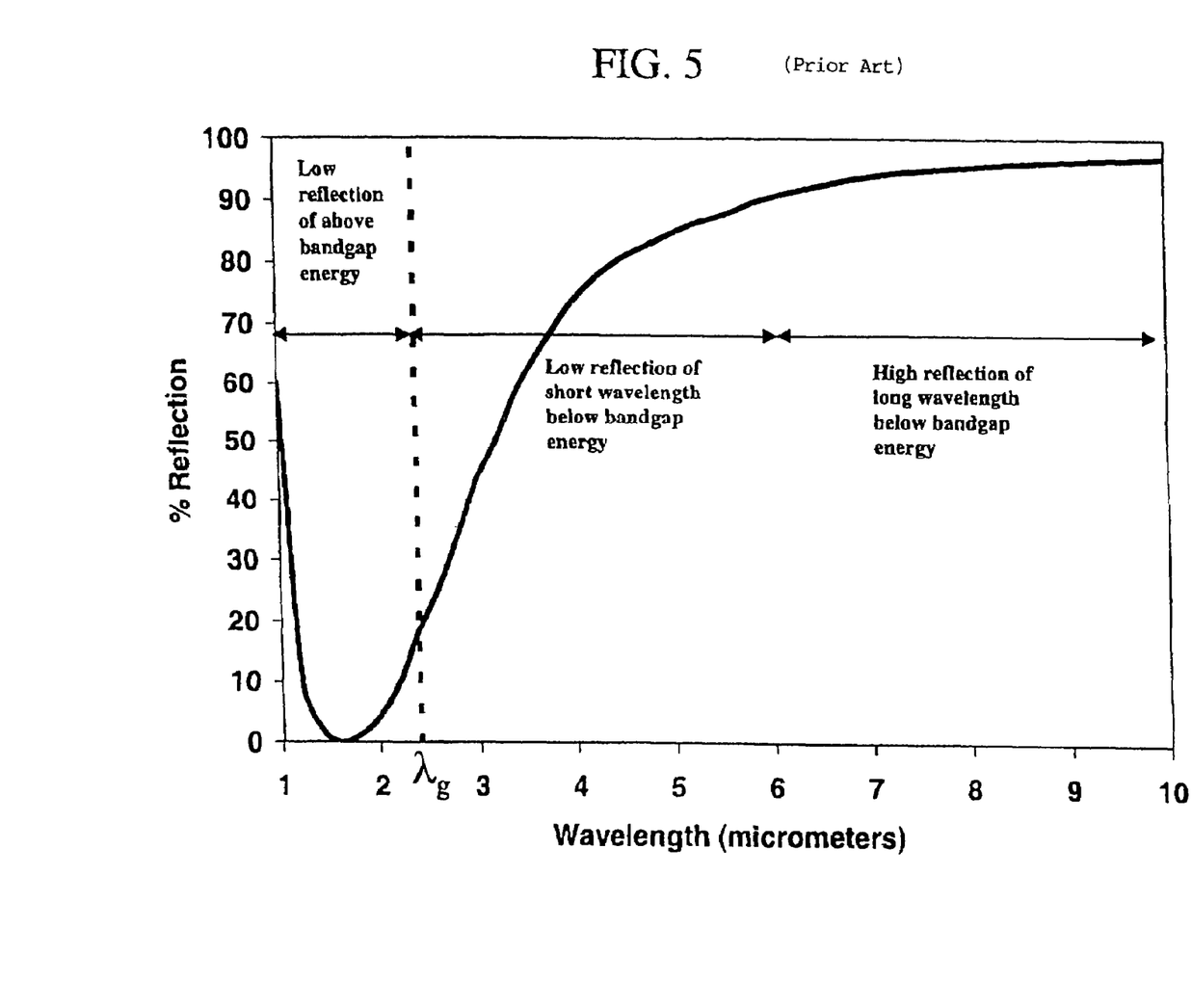
FIG. 5 illustrates the expected performance of a typical frequency selective surface designed to allow high transmission of above bandgap energy; specifically it presents the filter's reflection as a function of incident wavelength.

FIG. 5 illustrates the predicted performance of a typical frequency selective surface that has been designed to provide low reflection (high transmission) of all above bandgap energy. Although this filter provides high transmission of above bandgap energy, it does not exhibit an abrupt transition from low reflection (high transmission) to high reflection and, therefore, does not provide high reflection for short wavelength below bandgap energy. Therefore, frequency selective surfaces designed to maximize transmission of above bandgap energy do not meet all of the desired filter characteristics described above.

SUMMARY OF THE INVENTION

The present invention constitutes a novel combination of a frequency selective surface and an interference filter in a tandem configuration to overcome the limitations of each of the individual components. In particular, the frequency selective surface is designed to provide high transmission of above bandgap energy and high reflection of long wavelength below bandgap energy. The interference filter maintains high transmission of above bandgap energy and provides high reflection of short wavelength below bandgap energy and a sharp transition from high transmission to high reflection.

Figure 6:
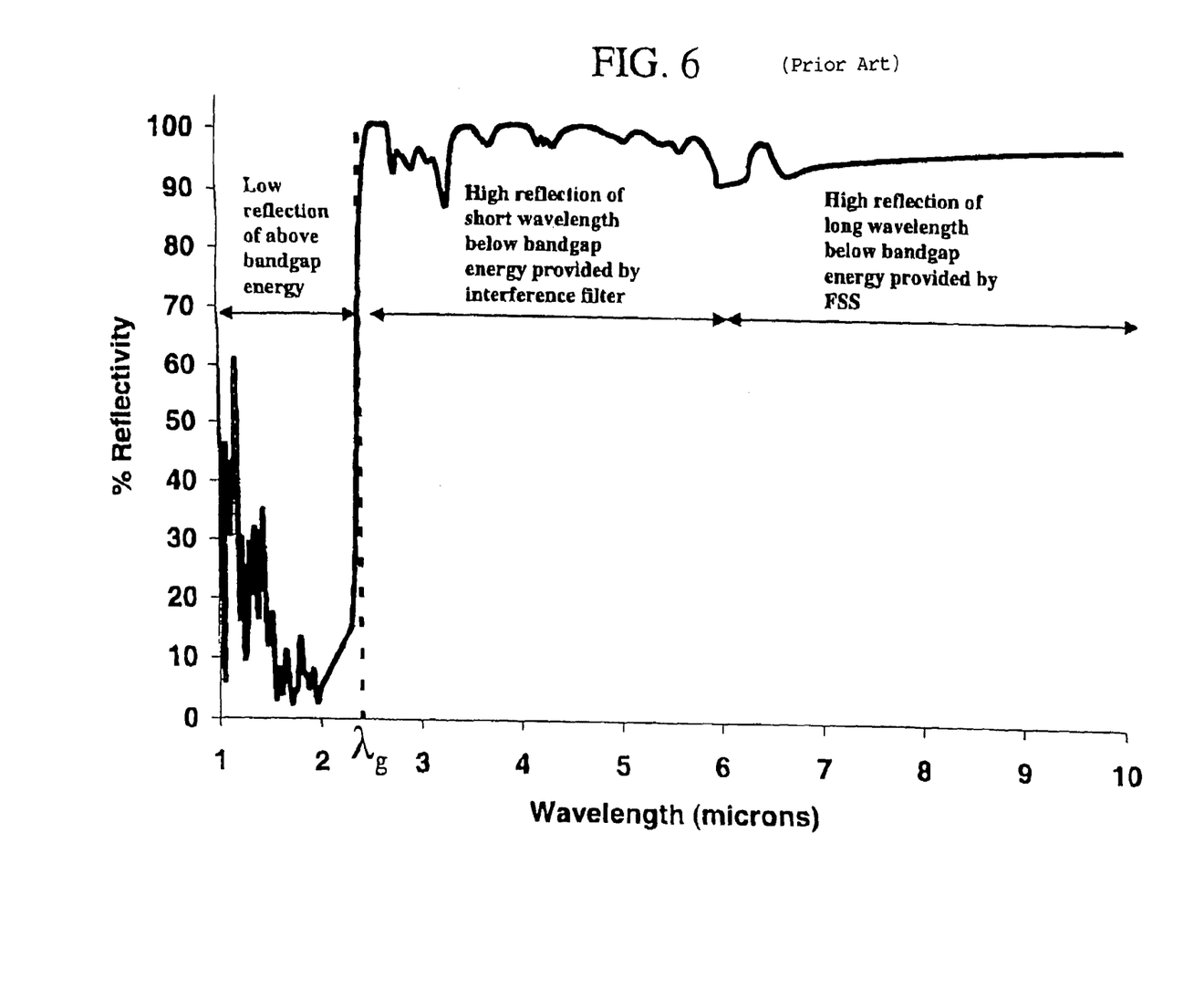
FIG. 6 illustrates the expected performance of a typical FSS tandem filter that uses a frequency selective surface and an interference filter; specifically it presents the filter's reflection as a function of incident wavelength.

FIG. 6 illustrates the expected reflection versus wavelength for the FSS/interference filter tandem concept. The tandem filter is composed of an interference filter (performance illustrated in FIG. 1) and an FSS designed for maximum transmission of above bandgap energy (performance illustrated in FIG. 5). As shown in FIG. 6, the reflection of the tandem filter at any particular wavelength is expected to be greater than or equal to the reflection of the individual components. Thus, the combination of an interference filter and an FSS in a tandem configuration provides a filter system that is expected to meet all of the desired filter characteristics described above.

The use of frequency selective surfaces in combination with interference filters in a tandem filter configuration for TPV applications presents an attractive alternative to the interference filter/plasma filter tandem concept described above because it may provide a cheaper alternative (FSS's are expected to be less expensive to mass manufacture compared to plasma filters that require epitaxial growth) with potentially higher performance.

These and other objects of the present invention will become apparent from the following detailed description.

BRIEF DESCRIPTION OF THE DRAWINGS

FIG. 10 A through 10D illustrate top down views of several FSS element geometries arranged in various array patterns.

DETAILED DESCRIPTION

Figure 7A:
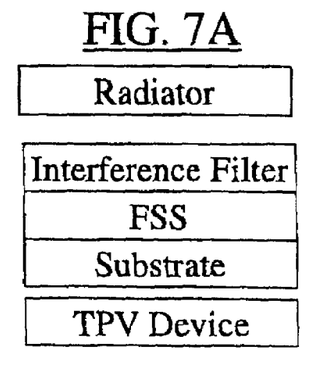
FIG. 7A through 7H illustrate four configurations for the preferred embodiment (interference filter placed between the radiator and FSS) and four configurations for an alternative embodiment (FSS placed between the interference filter and the radiator).
Figure 7B:
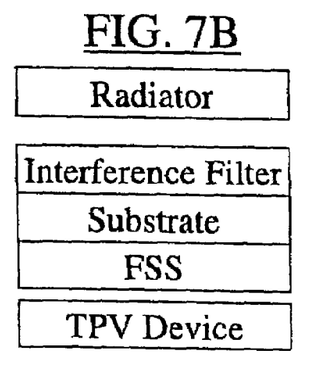
Figure 7C:
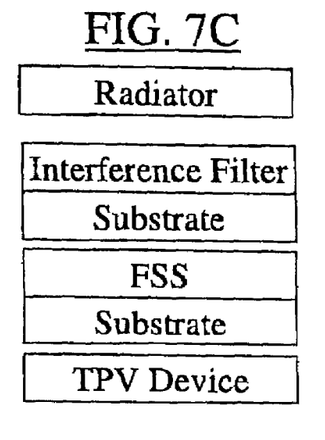
Figure 7D:
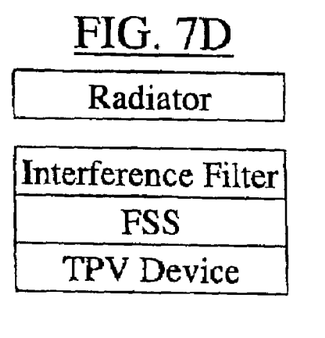

The present invention constitutes a novel combination of a frequency selective surface and an interference filter in a tandem configuration to overcome the limitations of each of the individual components. In the preferred embodiment of the present invention, the typical interference filter is disposed on top of the typical FSS such that photons from the radiator are first incident on the interference filter. In the preferred embodiment of the present invention, the FSS tandem filter may be fabricated in four configurations. In the first configuration, illustrated in FIG. 7A, the typical FSS is fabricated on a substrate and the typical interference filter is deposited directly on top of the typical FSS filter. The resulting FSS tandem filter is then mounted to a TPV device. In a second configuration, illustrated in FIG. 7B, the typical interference filter is deposited on the opposite side of the substrate that the typical FSS filter is fabricated upon and then the resulting FSS tandem filter is mounted to a TPV device. In a third configuration, illustrated in FIG. 7C, the typical interference filter is deposited on a separate substrate and mounted on top of the typical FSS filter. The resulting FSS tandem filter is then mounted to a TPV device. In the fourth configuration, illustrated in FIG. 7D, the FSS is fabricated directly on the TPV device and the interference filter is deposited directly onto the FSS.

In an alternate embodiment of the present invention, the typical FSS filter is disposed on top of the typical interference filter such that photons from the radiator are first incident on the FSS. In the alternate embodiment, the FSS tandem filter may also be fabricated in four configurations. The four configurations for the alternate embodiment are similar to the four configurations identified above for the preferred embodiment. In the first configuration, illustrated in FIG. 7E, the typical interference filter is deposited on a substrate and the typical FSS filter is fabricated directly on top of the typical interference filter. The resulting FSS tandem filter is then mounted to a TPV device. In the second configuration, illustrated in FIG. 7F, the typical FSS filter is fabricated on the opposite side of the substrate that the typical interference filter is deposited upon. The resulting FSS tandem filter is then mounted to a TPV device. In the third configuration, illustrated in FIG. 7G, the typical FSS filter is fabricated on a separate substrate, mounted on top of the typical interference filter and then the resulting FSS tandem filter is mounted to a TPV device. In the fourth configuration, illustrated in FIG. 7H, the interference filter is deposited directly on the TPV device and the FSS is fabricated directly on top of the interference filter.

A key component of the FSS tandem filter concept is the interference filter. The interference filter provides high transmission of above bandgap energy, high reflection of short wavelength below bandgap energy and a sharp transition from high transmission to high reflection.

There are two types of interference filters. One type of interference filter consists of a multi-layer deposition of optical coating materials with alternating high and low index of refraction, n. The total number of layers will range from about 10 to about 100 and is a strong function of the interference filter materials used. The thickness of the individual layers in the interference filter can range from about 0.02 micrometers to about 1 micrometer. This type of interference filter is called a discrete interference filter indicating that each layer is homogeneous (has an index of refraction that does not vary with the thickness of that layer) and that the index of refraction alternates from high to low in stepwise manner.

In another type of interference filter, called a rugate interference filter, the filter is fabricated using a continuously varying index of refraction. There are no discrete layers in this type of interference filter, rather, there is a single inhomogeneous layer where the index of refraction alternates between high and low in a continuous manner. The period of the rugate interference filter is the physical distance that represents one cycle from high index to low index and back to high index. For TPV applications, the period of the rugate interference filter typically ranges from about 0.5 micrometers to about 5 micrometers. The total number of periods for the rugate interference filter typically ranges from about 10 to about 100 and is a strong function of the rugate interference filter materials used.

Typical interference filters are fabricated using physical vapor deposition techniques including, but not limited to, electron beam evaporation, resistive evaporation, and sputtering. Ion beam assisted deposition can be used to improve the layer material microstructure and to improve the mechanical integrity and adhesion of the interference filter. Discrete interference filters are typically fabricated by depositing one material at a time and alternating between a high index material and a low index material. Rugate interference filters are typically fabricated using co-deposition of two materials to continuously blend or grade the index of refraction.

Interference filters can be fabricated from many different high and low index of refraction materials. For the preferred embodiment, where the typical interference filter is located between the radiator and the FSS (FIGS. 7A through 7D), the typical interference filter materials must have very low absorption for incident photons with wavelength ranging from 1 micrometer to about 10 micrometers. The low index of refraction materials typically have an index of refraction, $n_L$, less than or equal to 2.0.

High index of refraction materials typically have index of refraction, $n_H$, greater than 2.0. Optical coating materials that might be used for the preferred embodiment of the present invention include, but are not limited to, materials listed in Table 1.

TABLE 1

List of interference filter materials that can be used for the preferred embodiment.

| Low index of Refraction Materials | $n_L$ | High index of Refraction Materials | $N_H$ |
|---|---|---|---|
| Calcium Fluoride | ~1.4 | Zinc Sulfide | ~2.2 |
| Thorium Fluoride | ~1.45 | Zinc Selenide | ~2.4 |
| Barium Fluoride | ~1.35 | Antimony Sulfide | ~2.8 |
| Yttrium Fluoride | ~1.55 | Antimony Selenide | ~3.4 |
| Cerium Fluoride | ~1.6 | Arsenic Sulfide | ~2.6 |
| Hafnium Fluoride | ~1.55 | Arsenic Selenide | ~2.7 |
| Strontium Fluoride | ~1.5 | Arsenic Selenide Telluride | ~3.0 |
| Lanthanum Fluoride | ~1.5 | Silicon | ~3.4 |
| Neodymium Fluoride | ~1.5 | Gallium Arsenide | ~3.4 |
| Ytterbium Fluoride | ~1.5 | Indium Phosphide | ~3.3 |
| Dysprosium Fluoride | ~1.5 | Cadmium Sulfide | ~2.3 |
|  |  | Cadmium Selenide | ~2.4 |
|  |  | Zinc Phosphide | ~3.8 |

In the alternate embodiment, the typical FSS is deposited on top of the typical interference filter. An advantage of the alternate embodiment is that it enables the use of materials with a narrower low absorption wavelength range. For example, the alternate embodiment allows the use of materials with low absorption from about 1 to 5 micrometers compared to the much wider low absorption range of 1 to 10 micrometers required for the preferred embodiment. With the narrower low absorption wavelength range, several additional low index of refraction materials can be used as interference filter materials including, but not limited to those listed in Table 2.

TABLE 2

Additional interference filter materials enabled by using the alternate configuration.

| Materials | n |
|---|---|
| Silicon Nitride | ~2.2 |
| Magnesium Fluoride | ~1.35 |
| Silicon Monoxide | ~1.45 |
| Yttrium Oxide | ~1.8 |
| Hafnia | ~2.0 |
| Titanium Dioxide | ~2.2 |
| Niobia | ~1.9 |
| Tantalum Pentoxide | ~2.1 |
| Aluminum Fluoride | ~1.36 |
| Alumina | ~1.6 |
| Zirconium Oxide | ~2.1 |

Figure 8:
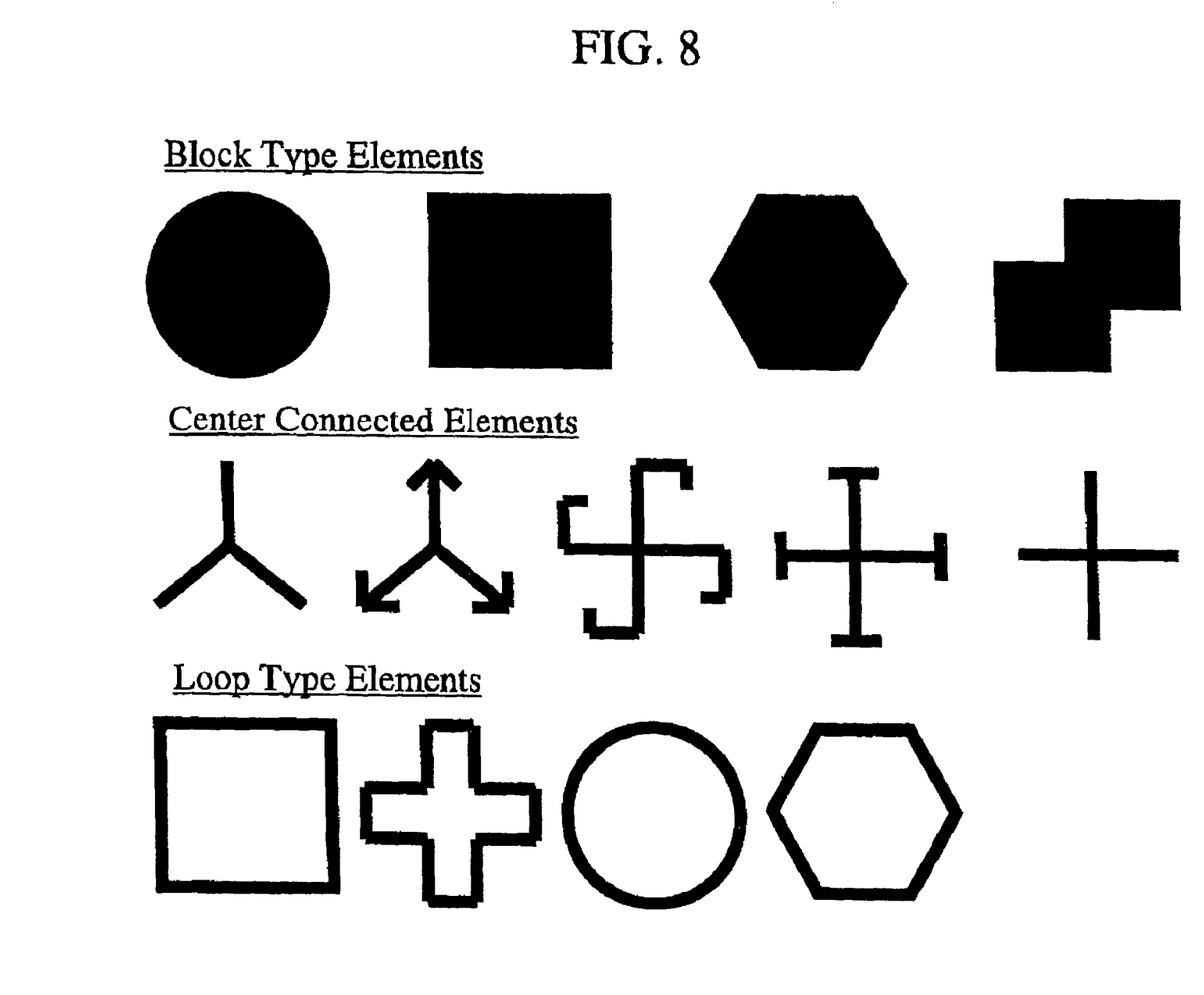
FIG. 8 illustrates several examples of FSS element geometries.

The frequency selective surface is designed to provide high transmission of above bandgap energy and high reflection of long wavelength below bandgap energy. A typical FSS consists of a two-dimensional periodic array of electromagnetic scattering elements. The performance of a typical FSS is governed by the size, shape, and spacing of the electromagnetic scattering elements. The electromagnetic scattering elements can be patches (isolated metal elements) and/or apertures (holes in a metal layer). The FSS may be designed with electromagnetic scattering element geometries including, but not limited to, circles, squares, hexagons, dipoles, crossed dipoles, tripoles, circular loops, square loops, and hexagonal loops. These element geometries and others are illustrated in FIG. 8.

Figure 9:
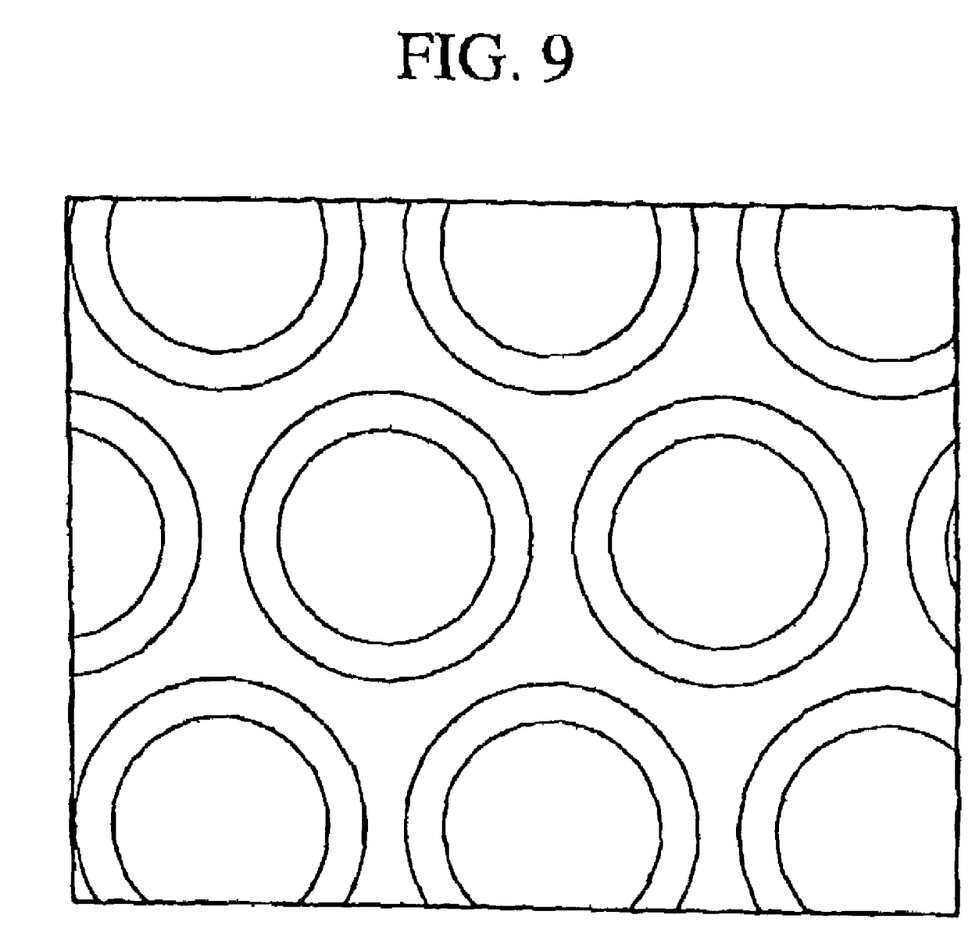
FIG. 9 illustrates a top down view of a hexagonal array of ring apertures.
Figure 10A:
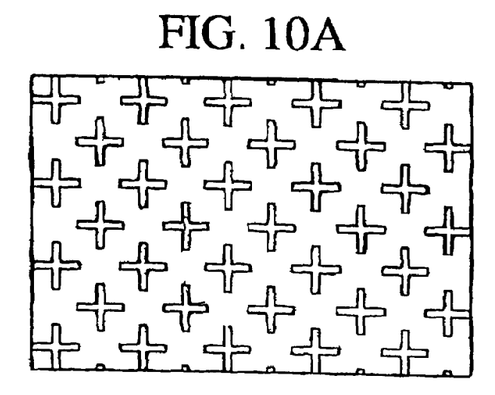
Figure 10B:
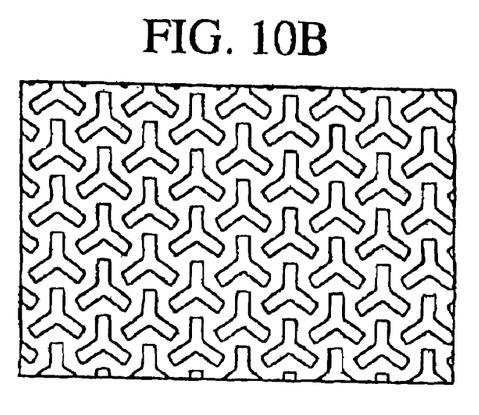

The electromagnetic scattering elements may be arranged in a hexagonal or square array. FIG. 9 illustrates a ring slot element geometry arranged in a hexagonal array pattern. FIG. 10A illustrates a crossed dipole element geometry arranged in an offset square array pattern. FIG. 10B illustrates a tripole element geometry arranged in a hexagonal array pattern.

Figure 10C:
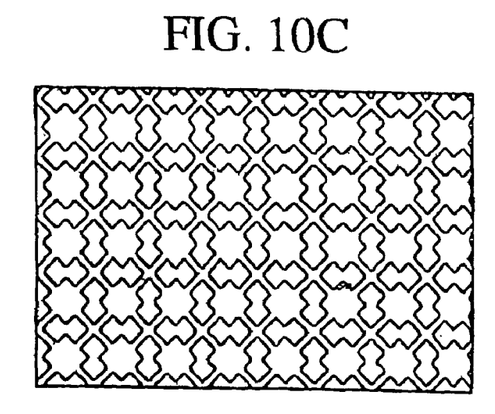

The FSS may be designed such that some elements are rotated with respect to the others. FIG. 10C illustrates a dipole element geometry arranged in an offset square array where the elements in every other row are rotated by 90 degrees.

Figure 10D:
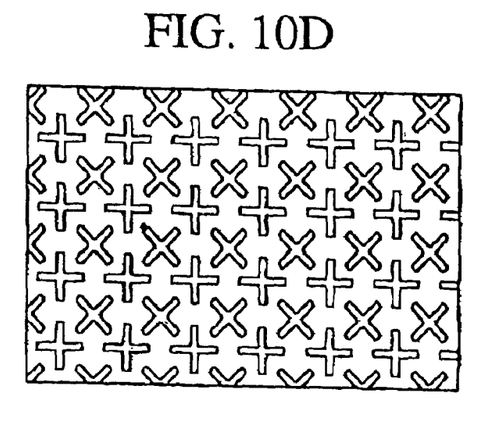

The FSS may be designed with greater than one electromagnetic scattering element geometry. FIG. 10D illustrates an FSS with two element geometries, crossed dipoles and rotated crossed dipoles each arranged in a square array pattern.

The FSS can be designed using arrangements of electromagnetic scattering elements in an array of holes or apertures that include, but are not limited to, those shown in FIGS. 9 and 10.

For thermophotovoltaic applications, the FSS's electromagnetic scattering elements described above will typically have sizes on the order of 0.5 micrometers, spacings between elements on the order of 0.1 micrometers, and minimum feature sizes (e.g., line width) on the order of 0.1 micrometers.

The FSS filters may have one or more layers. Each layer may contain elements with the same or different characteristics (sizes, shapes, spacings, type of array) and may have more than one element geometry within the same layer. Each FSS layer may be separated by dielectric materials including, but not limited to, the materials identified in Tables 1 and 2 above.

Fabrication of a typical FSS with these dimensions may be achieved using any of the following techniques: electron beam lithography, ion beam lithography, ultra-violet lithography (deep UV or extreme UV) with or without phase shift masking techniques, or nano-imprinting.

The FSS layer is typically fabricated from a metal with high reflectivity in the wavelength range of about 1 to 10 micrometers. Typical metals that meet this criteria include, but are not limited to, gold, aluminum, silver, platinum, and copper.

As described above, in the fourth configuration of the preferred embodiment and the alternate embodiment, the FSS tandem filter is deposited directly onto the TPV device. However, the first three configurations for both the preferred embodiment and the alternate embodiment require the use of at least one substrate to provide a surface for deposition of the interference filter and/or fabrication of the FSS. The substrate also provides structural integrity for the otherwise extremely thin (typically 5 to 25 micrometers) FSS tandem filter. The FSS tandem filter substrate will typically be 100 to 500 micrometers in thickness and is required to have both the front surface and the back surface polished in order to prevent diffuse scattering of the incident energy.

Figure 7E:
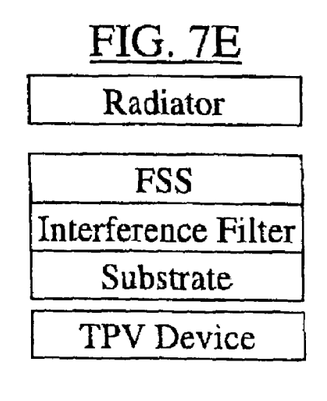
Figure 7F:
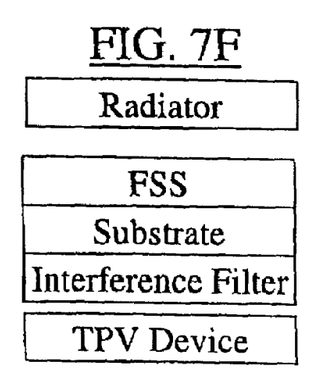
Figure 7G:
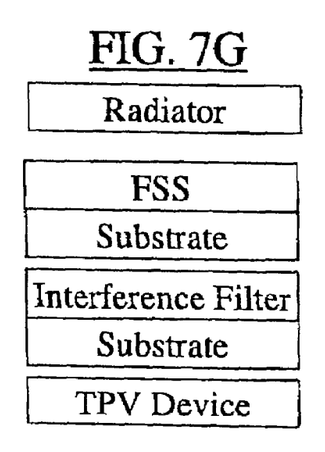
Figure 7H:
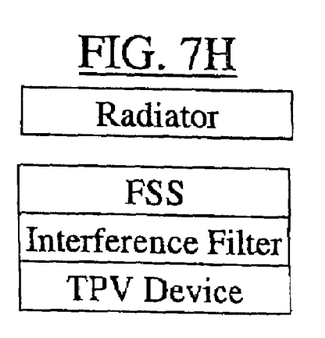

The various configurations of the preferred embodiment and the alternate embodiment have different requirements for the optical properties of the substrate material. The substrate material used in the first configuration for both the preferred embodiment (FIG. 7A) and the alternate embodiment (FIG. 7E) must have very low absorption for above bandgap energy (energy with wavelength between $1 < \lambda < _g$ which is about 1 to 2.48 micrometers for a TPV device with a bandgap of 0.50 eV). Typical substrate materials that meet this criteria include, but are not limited to, all of the materials listed in Table 1 and Table 2. The criteria and list of materials described above for a substrate used in the first configuration of the preferred embodiment (FIG. 7A) and the first configuration of the alternate embodiment (FIG. 7E)

also apply to the FSS substrate in the third configuration of the preferred embodiment (FIG. 7C) and the interference filter substrate in the third configuration of the alternate embodiment (FIG. 7G).

The substrate material used in the second configuration of the preferred embodiment (illustrated in FIG. 7B) and the substrate material used for the interference filter substrate in the third configuration of the preferred embodiment (FIG. 7C) have the same requirements for the optical properties. Specifically, in addition to having low absorption for above bandgap energy, the substrate material must also have very low absorption for long wavelength below bandgap energy (energy with wavelength between $2\lambda_g < \lambda < 10$ which is about 6 and 10 micrometers for a TPV device with a bandgap of 0.50 eV). This is necessary to prevent the long wavelength below bandgap energy from being absorbed in the substrate during transit to and from the FSS. Typical substrate materials that meet this criteria include, but are not limited to those identified in Table 1.

The substrate material used in the second configuration of the alternate embodiment (illustrated in FIG. 7F) and the substrate material used for the FSS substrate in the third configuration of the alternate embodiment (FIG. 7G) have the same requirements for the optical properties. Specifically, in addition to having low absorption for above bandgap energy, the substrate material must exhibit very low absorption for short wavelength below bandgap energy (energy with wavelength between $\lambda_g < \lambda < 2\lambda_g$ which is about 2.5 and 6 micrometers for a TPV device with a bandgap of 0.50 eV). This is necessary to prevent this short wavelength below bandgap energy from being absorbed in the substrate during transit to and from the interference filter. Typical substrate materials that meet this criteria include, but are not limited to those identified in Table 1 and silicon nitride, magnesium fluoride, and silicon monoxide.

The present invention improves the conversion efficiency of TPV energy systems by significantly increasing the reflectivity of the filter system in the below bandgap region. It further eliminates the need for back surface reflectors due to the potentially high below bandgap reflectivity of the FSS tandem filter. Still further, the FSS tandem filter of the present invention can potentially be produced at low cost using existing proven techniques.

The preferred embodiments of the present invention disclosed herein have been discussed for the purpose of familiarizing the reader with the novel aspects of the invention. Although preferred embodiments of this invention have been shown, many changes, modifications, and substitutions may be made by one having ordinary skill in the art without departing from the scope and spirit of the invention as described in the following claims.

We claim:

1. A thermophotovoltaic energy conversion system tandem filter for a TPV device having a semiconductor bandgap energy comprising a frequency selective surface in tandem configuration with an interference filter, wherein said frequency selective surface provides high transmission of above-bandgap energy and high reflection of long wavelength below-bandgap energy and said interference filter maintains high transmission of above-bandgap energy and provides high reflection of short wavelength below-bandgap energy and a sharp transition from high transmission to high reflection, and wherein said frequency selective surface is a two-dimensional periodic array of electromagnetic scattering elements.

2. The tandem filter of claim 1 wherein said frequency selective surface is deposited on a substrate and said interference filter is deposited on said frequency selective surface, and wherein said tandem filter is mounted on said TPV device such that photons from a radiator are first incident on said interference filter.

3. The tandem filter of claim 1, wherein said interference filter is deposited on a first surface of a substrate and said frequency selective surface is deposited on a second surface of said substrate, and wherein said tandem filter is mounted on said TPV device such that photons from a radiator are first incident on said interference filter.

4. The tandem filter of claim 1, wherein said interference filter is deposited on a first substrate, said frequency selective surface is deposited on a second substrate, and said interference filter deposited on said first substrate is mounted on said frequency selective surface deposited on said second substrate, and wherein said tandem filter is mounted on said TPV device such that photons from a radiator are first incident on said interference filter.

5. The tandem filter of claim 1, wherein said frequency selective surface is deposited on said TPV device and said interference filter is deposited directly on said frequency selective surface, and said tandem filter is mounted such that photons from a radiator are first incident on said interference filter.

6. The tandem filter of claim 2, wherein said interference filter comprises alternating layers of low refraction index materials and high refraction index materials.

7. The tandem filter of claim 6, wherein said low refractive index materials have a low absorption of incident photons with a wavelength range of about 1 to about 10 micrometers, and have an index of refraction less than or equal to about 2.0; and wherein said high refractive index materials have a low absorption of incident photons with a wavelength range of about 1 to about 10 micrometers, and have an index of refraction greater than 2.0.

8. The tandem filter of claim 3, wherein said interference filter comprises alternating layers of low refractive index materials and high refractive index materials.

9. The tandem filter of claim 8, wherein said low refractive index materials have a low absorption of incident photons with a wavelength range of about 1 to about 10 micrometers, and have an index of refraction less than or equal to about 2.0; and wherein said high refractive index materials have a low absorption of incident photons with a wavelength range of about 1 to about 10 micrometers, and have an index of refraction greater than 2.0.

10. The tandem filter of claim 4, wherein said interference filter comprises alternating layers of low refractive index materials and high refractive index materials.

11. The tandem filter of claim 10, wherein said low refractive index materials have a low absorption of incident photons with a wavelength range of about 1 to about 10 micrometers, and have an index of refraction less than or equal to about 2.0; and wherein said high refractive index materials have a low absorption of incident photons with a wavelength range of about 1 to about 10 micrometers, and have an index of refraction greater than 2.0.

12. The tandem filter of claim 5, wherein said interference filter comprises alternating layers of low refractive index materials and high refractive index materials.

13. The tandem filter of claim 12, wherein said low refractive index materials have a low absorption of incident photons with a wavelength range of about 1 to about 10 micrometers, and have an index of refraction less than or equal to about 2.0; and wherein said high refractive index materials have a low absorption of incident photons with a wavelength range of about 1 to about 10 micrometers, and have an index of refraction greater than 2.0.

14. The tandem filter of claim 2, wherein said substrate has a low absorption for above bandgap energy.

15. The tandem filter of claim 3, wherein said substrate has a low absorption for above bandgap energy and a low absorption for long wavelength below bandgap energy.

16. The tandem filter of claim 4, wherein said first substrate has a low absorption for above bandgap energy and a low absorption for long wavelength below bandgap energy and said second substrate has a low absorption for above bandgap energy.

17. The tandem filter of claim 1, wherein said interference filter is a discrete interference filter having multiple homogenous layers, said multiple layers alternating between high index of refraction layers and low index of refraction layers.

18. The tandem filter of claim 17, wherein said discrete interference filter has about 10 to about 100 layers.

19. The tandem filter of claim 17, wherein said multiple layers of said discrete interference filter have individual layers with thickness ranging from about 0.02 to about 1 micrometer.

20. The tandem filter of claim 1, wherein said interference filter is a rugate interference filter having a single inhomogenous layer with a continuously varying index of refraction.

21. The tandem filter of claim 20, wherein said rugate interference filter has a period ranging from about 0.5 to about 5 micrometers.

22. The tandem filter of claim 21, wherein said rugate interference filter has a total number of periods ranging from about 10 to about 100.

23. The tandem filter of claim 1, wherein said interference filter is fabricated using physical vapor deposition techniques.

24. The tandem filter of claim 17, wherein said discrete interference filter is fabricated using said physical vapor deposition techniques by depositing one layer at a time and alternating between high refractive index materials and low refractive index materials.

25. The tandem filter of claim 20, wherein said rugate interference filter is fabricated using said physical vapor deposition techniques by co-depositing a plurality of materials.

26. The tandem filter of claim 1, wherein said electromagnetic scattering elements comprise patches.

27. The tandem filter of claim 1, wherein said electromagnetic scattering elements comprise apertures.

28. The tandem filter of claim 1, wherein said electromagnetic scattering elements comprise patches and apertures.

29. The tandem filter of claim 1, wherein said frequency selective surface comprises electromagnetic scattering element geometries comprising circles, squares, hexagons, polygons, dipoles, cross dipoles, tripoles, circular loops, square loops, hexagonal loops, or polygonal loops.

30. The tandem filter of claim 1, wherein said electromagnetic scattering elements are arranged in a hexagonal or square array.

31. The tandem filter of claim 1, wherein at least one of said electromagnetic scattering elements is rotated with respect to other said electromagnetic scattering elements.

32. The tandem filter of claim 1, wherein said electromagnetic scattering elements are about 0.5 micrometers in size, wherein said electromagnetic scattering elements are spaced about 0.1 micrometers apart, and wherein minimum feature sizes of electromagnetic scattering elements are about 0.1 micrometers in size.

33. The tandem filter of claim 1, wherein said frequency selective surface comprises at least one metal layer having high reflectivity in the wavelength range of about 1 to about 10 micrometers, and at least one dielectric layer.

34. The tandem filter of claim 1, wherein said frequency selective surface is fabricated using nano-imprinting.

35. The tandem filter of claim 1, wherein said frequency selective surface is fabricated using electron beam lithography.

36. The tandem filter of claim 1, wherein said frequency selective surface is fabricated using ion beam lithography.

37. The tandem filter of claim 1, wherein said frequency selective surface is fabricated using ultra-violet lithography.

38. The tandem filter of claim 37, wherein said ultra-violet lithography uses phase shift masking techniques.

39. The tandem filter of claim 2, wherein said substrate is about 100 to 500 micrometers thick and wherein a first surface of said substrate and a second surface of said substrate are polished.

40. The tandem filter of claim 3, wherein said substrate is about 100 to 500 micrometers thick and wherein said first surface of said substrate and said second surface of said substrate are polished.

41. The tandem filter of claim 4, wherein said substrates are about 100 to 500 micrometers thick and wherein a first surface of each substrate and a second surface of each substrate are polished.

* * * * *